United States Patent
Kobayashi

(10) Patent No.: US 12,110,188 B2
(45) Date of Patent: Oct. 8, 2024

(54) TRANSFER VEHICLE SYSTEM

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 586 days.

(21) Appl. No.: 17/434,426

(22) PCT Filed: Feb. 5, 2020

(86) PCT No.: PCT/JP2020/004398
§ 371 (c)(1),
(2) Date: Aug. 27, 2021

(87) PCT Pub. No.: WO2020/195200
PCT Pub. Date: Oct. 1, 2020

(65) Prior Publication Data
US 2022/0144557 A1 May 12, 2022

(30) Foreign Application Priority Data
Mar. 22, 2019 (JP) .................. 2019-055166

(51) Int. Cl.
*B65G 43/08* (2006.01)
*B61B 13/00* (2006.01)
(Continued)

(52) U.S. Cl.
CPC .............. *B65G 43/08* (2013.01); *B61B 13/00* (2013.01); *H01L 21/67727* (2013.01);
(Continued)

(58) Field of Classification Search
CPC ......... H01L 21/67706; H01L 21/67724; H01L 21/67733; H01L 21/677; H01L 21/67709;
(Continued)

(56) References Cited

U.S. PATENT DOCUMENTS 11,414,275 B2* 8/2022 Hou ...................... G06Q 10/00
2020/0361041 A1* 11/2020 Chien ............... H01L 21/67745
2022/0258990 A1* 8/2022 Choi ................ H01L 21/67706

FOREIGN PATENT DOCUMENTS

JP 56-106102 A 8/1981
JP 05-061106 U 8/1993
(Continued)

OTHER PUBLICATIONS

English translation of Official Communication issued in International Patent Application No. PCT/JP2020/004398, mailed on Oct. 7, 2021.
(Continued)

*Primary Examiner* — Timothy R Waggoner
(74) *Attorney, Agent, or Firm* — Keating & Bennett, LLP

(57) ABSTRACT

A transfer vehicle system in which transfer vehicles travel on a track includes a measurement portion in a portion of a path continuing to the track to measure a measurement target portion included in the transfer vehicle on the path, an identifier to identify the transfer vehicle for which the measurement target portion has been measured by the measurement portion, a storage to store a measurement result measured by the measurement portion and an identification result identified by the identifier in association with each other, and a display to provide notification of information concerning a state of the measurement target portion determined based on the measurement result and a reference value.

8 Claims, 7 Drawing Sheets

(51) Int. Cl.
   *G01B 21/16*   (2006.01)
   *H01L 21/677*  (2006.01)
(52) U.S. Cl.
   CPC ............... *B65G 2201/0297* (2013.01); *B65G 2203/0233* (2013.01); *G01B 21/16* (2013.01); *H01L 21/67724* (2013.01); *H01L 21/67733* (2013.01)
(58) Field of Classification Search
   CPC ......... H01L 21/67294; H01L 21/67259; H01L 21/67727; B65G 2201/0297; B65G 43/02; B65G 1/0457; B65G 43/08; G05D 1/02; B61B 3/02; B61B 13/00
   See application file for complete search history.

(56) References Cited

FOREIGN PATENT DOCUMENTS

| | | | | |
|---|---|---|---|---|
| JP | 5787330 B1 | 9/2015 | | |
| JP | 2016-083980 A | 5/2016 | | |
| JP | 2018132332 A | * 8/2018 | ............... | B61K 9/12 |
| TW | I648209 B | 1/2019 | | |

OTHER PUBLICATIONS

Official Communication issued in International Patent Application No. PCT/JP2020/004398, mailed on Mar. 24, 2020.

* cited by examiner

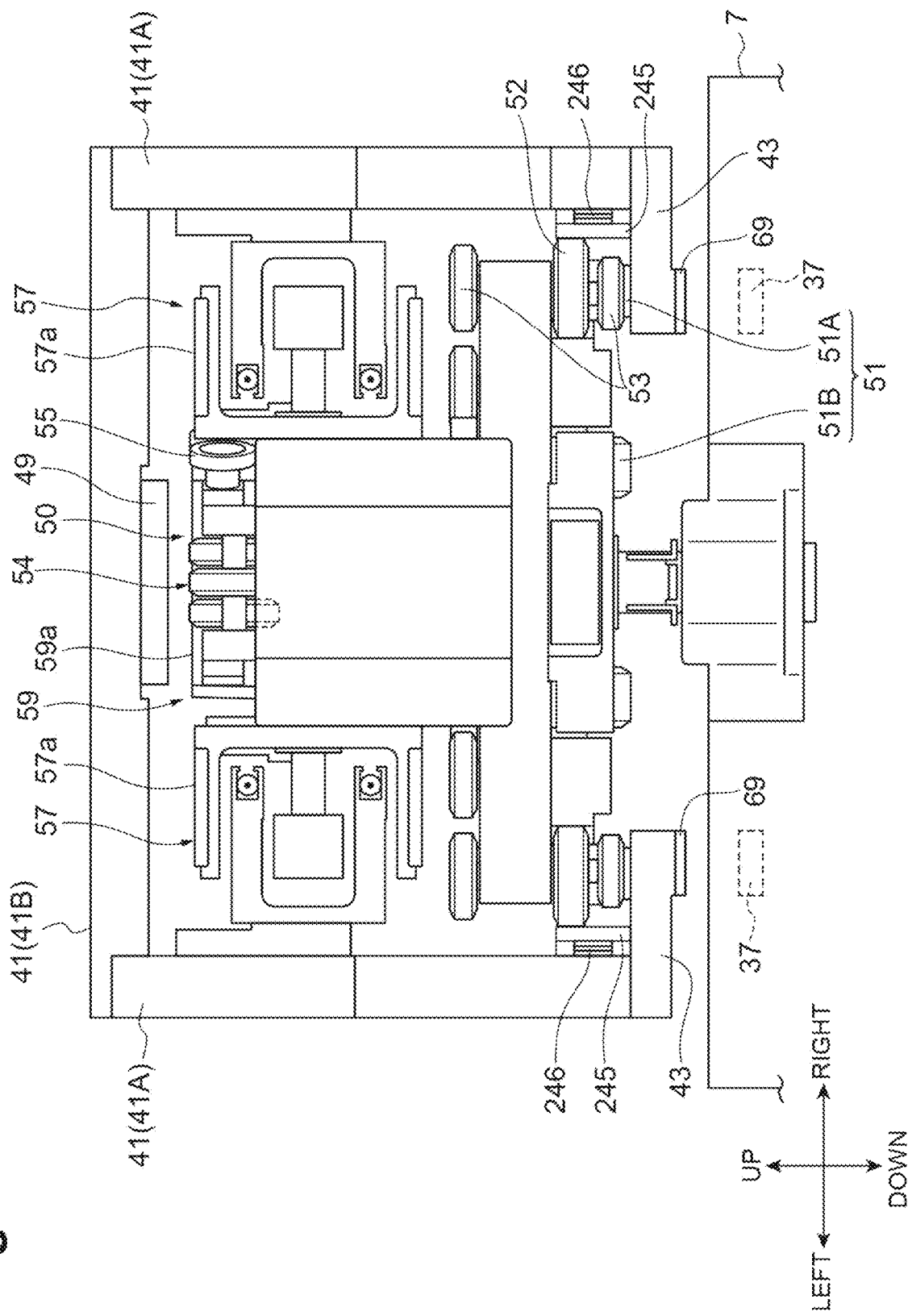

TRANSFER VEHICLE SYSTEM

BACKGROUND OF THE INVENTION

1. Field of the Invention

One aspect of a preferred embodiment of the present invention relates to a transfer vehicle system.

2. Description of the Related Art

A transfer vehicle system that travels on a predetermined path and transports an article has been known. In such a transfer vehicle system, acquiring a transport state of a traveling transfer vehicle has been performed conventionally. For example, Japanese Unexamined Utility Model Publication No. H5-061106 discloses a packing-style detection system provided with a detection device that is provided in a traveling path and detects the packing style of a load that is transported by a carriage without contacting the load. According to this packing-style detection system, the packing style of the load that is being transported by the carriage can be detected.

SUMMARY OF THE INVENTION

In recent years, further labor saving has been demanded for the purpose of coping with the labor shortage and the like. In the above-described transfer vehicle system in which a plurality of transfer vehicles travel on the transport path, it takes a lot of time for maintenance of checking and adjusting the state of each transfer vehicle. Accordingly, if such maintenance work and the like can be made efficient, the effect of labor saving will be great.

Preferred embodiments of the present invention provide transfer vehicle systems, in which a plurality of transfer vehicles travel, each being capable of making maintenance work and the like of each transfer vehicle efficient.

A transfer vehicle system according to one aspect of a preferred embodiment of the present invention in which a plurality of transfer vehicles travel on a predetermined transport path includes a measurement portion provided at a portion of a path continuing to the transport path to measure a measurement target portion included in the transfer vehicle located on the continuing path, an identifier to identify the transfer vehicle for which the measurement target portion has been measured by the measurement portion, a storage to store therein a measurement result measured by the measurement portion and an identification result identified by the identifier in association with each other, and a notifier to provide notification of information concerning a state of the measurement target portion determined based on the measurement result and a reference value.

The transfer vehicle system of this configuration is provided, at a portion of the path continuing to the transport path, with the measurement portion to measure the measurement target portion included in the transfer vehicle located on this path, so that measuring the measurement target portion of the transfer vehicle in operation (traveling) at a manufacturing site and the like can be performed. That is, the measured value of the measurement target portion can be obtained without human intervention. Although a plurality of transfer vehicles travel in the transfer vehicle system, the transfer vehicle for which the measurement target portion has been measured is identified by the identifier, so that the measurement result is stored for each transfer vehicle. Accordingly, the worker can, based on the measured value stored for each transfer vehicle, perform maintenance at appropriate timing for each transfer vehicle. As a result, the maintenance work and the like of each transfer vehicle can be made efficient.

In a transfer vehicle system according to one aspect of a preferred embodiment of the present invention, when the measurement result has exceeded a predetermined value, the notifier may notify accordingly. In this configuration, for example, by setting a predetermined value that needs component replacement or a predetermined value that needs adjustment in advance, it makes it possible to provide notification of the presence of the transfer vehicle that needs component replacement or the transfer vehicle that needs adjustment.

In a transfer vehicle system according to one aspect of a preferred embodiment of the present invention, the storage may store therein the measurement result for each transfer vehicle in chronological order, and when a rate of change calculated based on the measurement result stored in the storage has exceeded a predetermined value, the notifier may provide notification accordingly. In this configuration, even when each transfer vehicle has a different initial value of the measurement target portion, for example, by setting the rate of change at which component replacement is needed or the rate of change at which adjustment is needed in advance, it is possible to provide notification of the presence of a transfer vehicle that needs component replacement or a transfer vehicle that needs adjustment.

In a transfer vehicle system according to one aspect of a preferred embodiment of the present invention, the transport path may include a main path circulating in a predetermined area in one direction and an introduction path configured to introduce the transfer vehicle into the main path, and the measurement portion may be provided in the introduction path. In the configuration in which the measurement portion is provided in the introduction path, the initial value of the transfer vehicle before operation can be measured, and an initial failure, maintenance failure, or the like in which the transfer vehicle cannot be operated in the main path can be detected beforehand.

In a transfer vehicle system according to one aspect of a preferred embodiment of the present invention, the transport path may be a track on which a traveling portion of the transfer vehicle travels, the track may include an inspection plate to press the traveling portion in a width direction orthogonal to an extending direction of the track, and the measurement portion may measure the measurement target portion of the transfer vehicle in a state of being pressed by the inspection plate. With this configuration, the measurement target portion can be measured in a state in which the traveling portion is maintained in the same posture, so that the measurement accuracy can be increased.

In a transfer vehicle system according to one aspect of a preferred embodiment of the present invention, the measurement portion may measure a distance to the inspection plate. With this configuration, even when the measurement target portion is at a place difficult to measure from the point of view of the measurement portion, the measurement target portion can be measured indirectly.

According to one aspect of a preferred embodiment of the present invention, in a transfer vehicle system in which a plurality of transfer vehicles travel, the maintenance work and the like of each transfer vehicle can be made efficient.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a perspective view illustrating a dedicated track according to a modification of a preferred embodiment of the present invention.

DETAILED DESCRIPTION OF THE PREFERRED EMBODIMENTS

Figure 1:
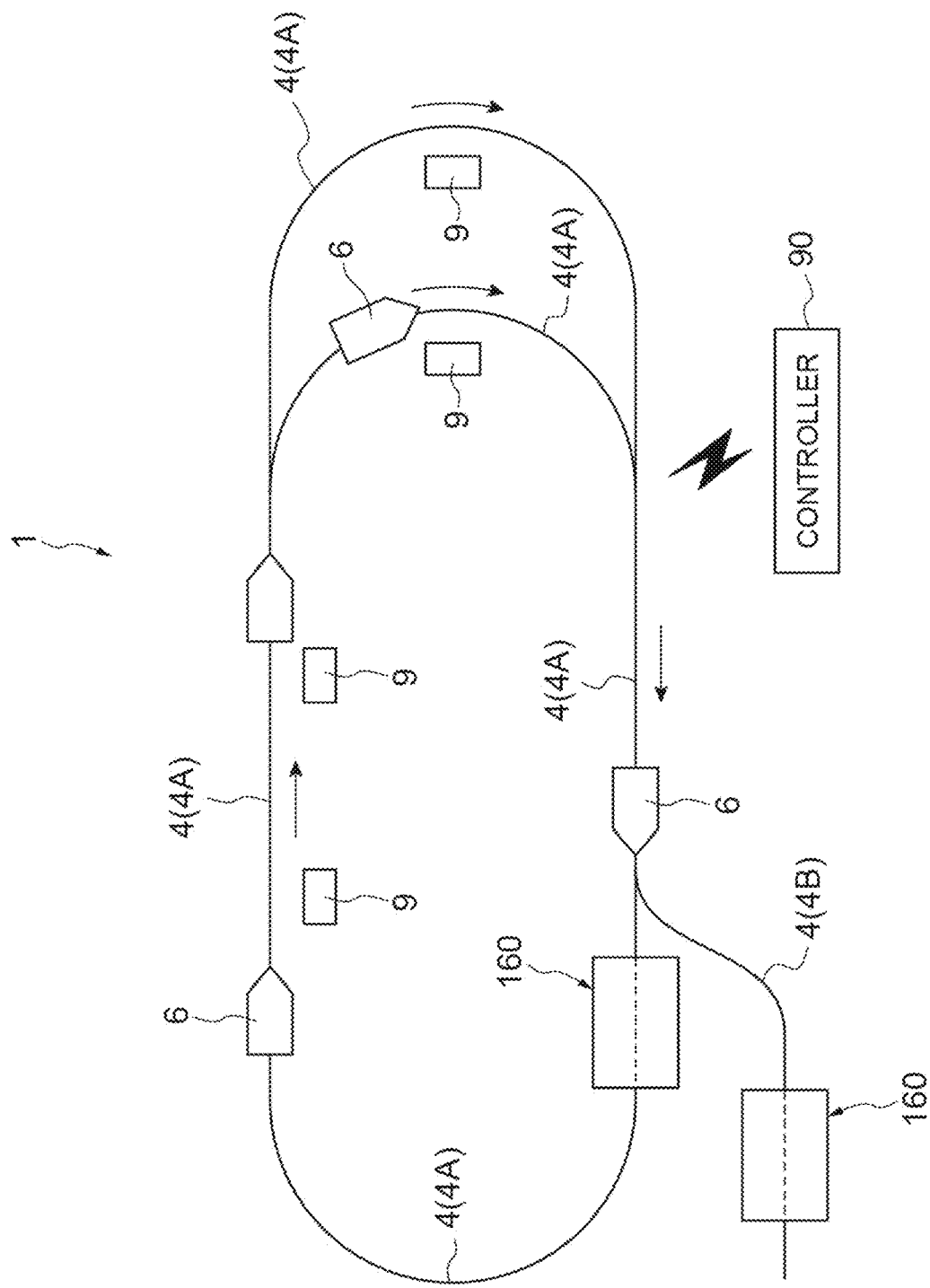
FIG. 1 is a schematic plan view illustrating a transfer vehicle system according to a preferred embodiment of the present invention.

With reference to the accompanying drawings, the following describes preferred embodiments of the present invention in detail. In the description of the drawings, identical constituent elements will be denoted by identical reference signs and redundant explanations will be omitted. In the drawings except FIG. 1 and FIG. 4, "up", "down", "left", "right", "front", and "rear" directions are defined for the convenience of explanation.

Figure 2:
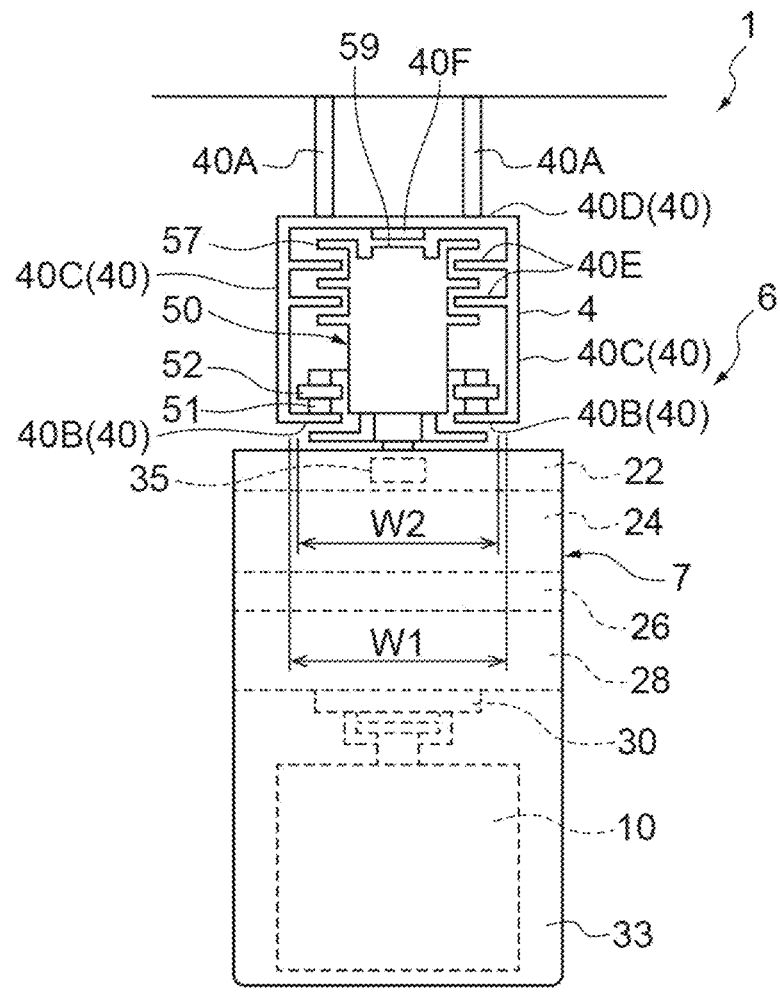
FIG. 2 is a schematic front view of an overhead transfer vehicle in FIG. 1 as viewed from a traveling direction.

As illustrated in FIG. 1 and FIG. 2, a transfer vehicle system 1 is a system to transfer, by using an overhead transfer vehicle 6 capable of moving along a track (predetermined traveling path) 4, an article 10 between placement portions 9 and 9. The article 10 includes a FOUP (Front Opening Unified Pod) to store a plurality of semiconductor wafers, a container to store a glass substrate, a container such as a reticle pod, and general components, for example. In this case, the transfer vehicle system 1 in which, for example, in a factory or the like, the overhead transfer vehicle 6 (hereinafter, referred to simply as "transfer vehicle 6") travels along a one-way track 4 that is laid on the ceiling or the like of the factory will be described as an example. The transfer vehicle system 1 includes the track 4, a plurality of transfer vehicles 6, a plurality of placement portions 9, measurement units 160, and a control device 80 (see FIG. 4).

The track 4 is laid near the ceiling that is an overhead space of a worker, for example. The track 4 is suspended from the ceiling, for example. The track 4 is a predetermined traveling path on which the transfer vehicle 6 travels. The track 4 is supported by supporting columns 40A and 40A. The track 4 of the transfer vehicle system 1 includes a main track (main path) 4A circulating in a predetermined area in one direction and an introduction track (introduction path) 4B provided to merge into the main track 4A and configured to introduce the transfer vehicle 6.

The track 4 includes a tubular main body portion 40 including a pair of lower surface portions 40B, a pair of lateral surface portions 40C and 40C, and a top surface portion 40D. The track 4 includes feeding portions 40E and a magnetic plate 40F. The lower surface portions 40B extend in the traveling direction of the transfer vehicle 6 and define the lower surface of the main body portion 40. The lower surface portions 40B are plate-shaped members on which the traveling rollers 51 of the transfer vehicle 6 roll and travel. The lateral surface portions 40C extend in the traveling direction of the transfer vehicle 6 and define the lateral surfaces of the main body portion 40. The distance W1 between inner surfaces of the pair of lateral surface portions 40C and 40C is longer than the distance W2 between outer peripheral surfaces of side rollers 52 of the transfer vehicle 6 in the width direction (left-and-right direction) orthogonal to the traveling direction. The top surface portion 40D extends in the traveling direction of the transfer vehicle 6 and defines the upper surface of the main body portion 40.

The feeding portions 40E are portions that supply electric power to power feeding cores 57 of the transfer vehicle 6 and transmit and receive signals (superimposed communication) to and from the transfer vehicle 6. The feeding portions 40E are fixed to each of the pair of lateral surface portions 40C and 40C and extend along the traveling direction. The feeding portions 40E supply electric power to the power feeding cores 57 in a non-contact state. The magnetic plate 40F generates a magnetic force for traveling or stopping in an LDM (Linear DC Motor) 59 (see FIG. 3) of the transfer vehicle 6. The magnetic plate 40F is fixed to the top surface portion 40D and extends along the traveling direction.

The transfer vehicle 6 travels along the track 4 and transports the article 10. The transfer vehicle 6 is configured to be able to transfer the article 10. The transfer vehicle 6 is a ceiling-traveling type unmanned transfer vehicle. The number of transfer vehicles 6 included in the transfer vehicle system 1 is not particularly limited and is preferably plural. The transfer vehicle 6 includes a main body portion 7, a traveling portion 50, and a controller 35. The main body portion 7 includes a main body frame 22, a lateral feed portion 24, a θ drive 26, an elevating drive portion 28, an elevating table 30, and front/rear frames 33.

The lateral feed portion 24 transversely feeds the θ drive 26, the elevating drive portion 28, and the elevating table 30 collectively in the direction perpendicular to the traveling direction of the track 4. The θ drive 26 turns at least one of the elevating drive portion 28 and the elevating table 30 within a predetermined angle range in a horizontal plane. The elevating drive portion 28 raises and lowers the elevating table 30 by winding or feeding out suspending material such as a belt, a wire, and a rope. The elevating table 30 is provided with a chuck and the article 10 can be freely grasped or released. The front/rear frames 33 are provided in a pair at front and rear in the traveling direction of the transfer vehicle 6, for example. The front/rear frames 33 prevent the article 10 from falling during transfer by making claws and the like not depicted appear and disappear.

Figure 3:
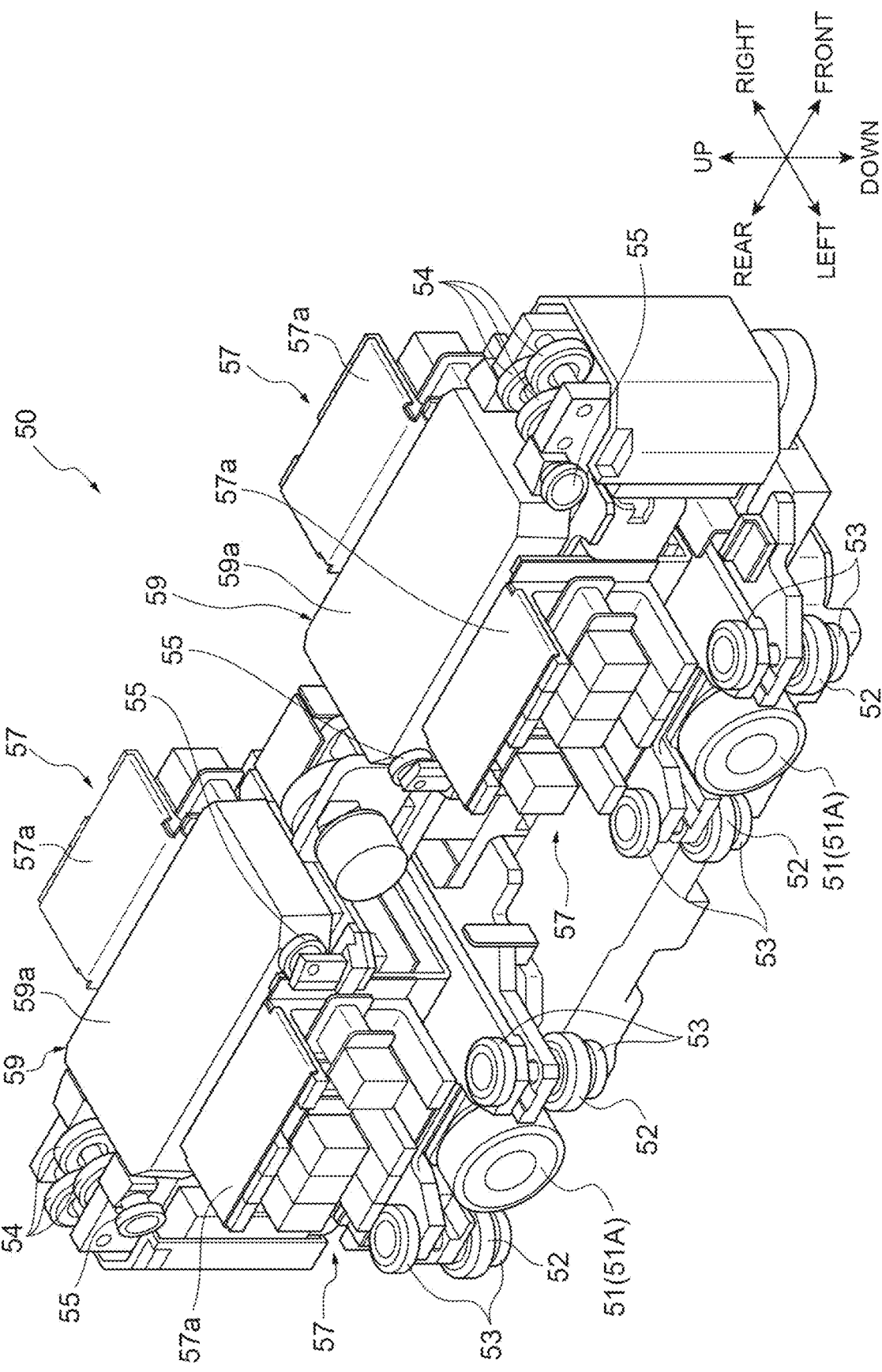
FIG. 3 is a perspective view illustrating a traveling portion of the transfer vehicle in an enlarged manner.
Figure 6:
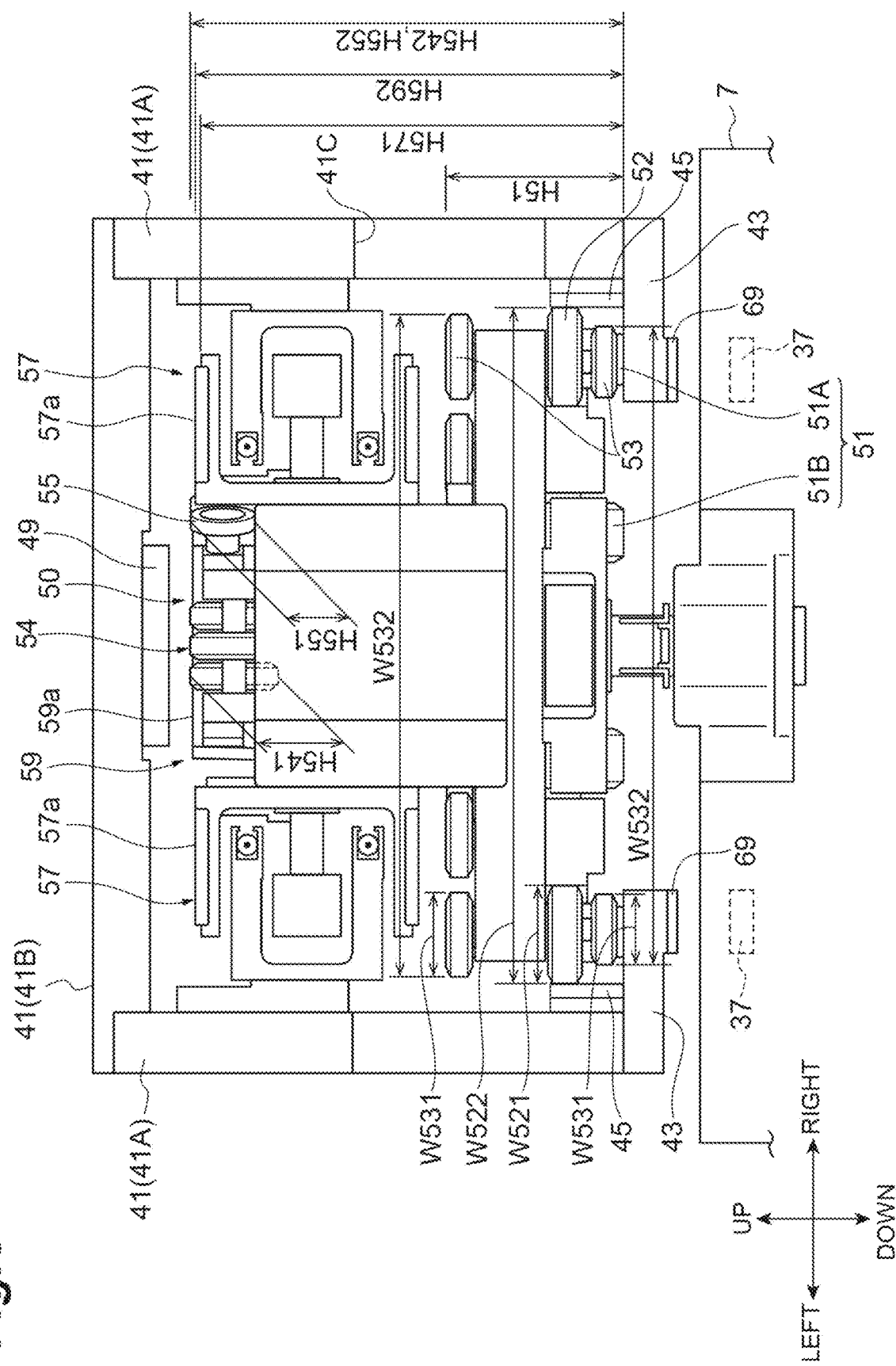
FIG. 6 is a diagram illustrating measurement target portions measured by a measurement unit.

The traveling portion 50 lets the transfer vehicle 6 travel along the track 4. As illustrated in FIG. 3 and FIG. 6, the traveling portion 50 includes traveling rollers 51, the side rollers 52, branch rollers 53, auxiliary rollers 54, inclined rollers 55, the power feeding cores 57, and the LDMs 59. In FIG. 2, the depiction of the branch rollers 53, the auxiliary rollers 54, and the inclined rollers 55 is omitted.

The traveling roller 51 is a roller pair including an outer wheel 51A and an inner wheel 51B. The traveling rollers 51 are arranged on both left and right ends at the front and rear of the traveling portion 50. The traveling rollers 51 roll on the pair of lower surface portions 40B and 40B (or lower supporting portions 43 in FIG. 5 described later) of the track 4. The side rollers 52 are arranged so as to sandwich each of the outer wheels 51A of the traveling rollers 51 in the front-and-rear direction. The side rollers 52 are capable of contacting the lateral surface portions 40C (or lateral supporting portions 45 in FIG. 5 described later) of the track 4. The branch rollers 53 are arranged so as to sandwich each of the side rollers 52 in the up-and-down direction. The side rollers 52 are capable of contacting guides (not depicted) that are arranged in connection portions, branch portions, or the like of the track 4.

The auxiliary rollers 54 are a group of three rollers provided at the front and rear of the traveling portion 50. The auxiliary rollers 54 prevent the LDMs 59, the power feeding cores 57, and the like from coming into contact with the magnetic plate 40F (or a magnetic plate 49 in FIG. 5 described later) that is arranged on the upper surface of the track 4 when the traveling portion 50 is inclined forward or rearward during traveling due to acceleration, deceleration, or the like. The inclined rollers 55 are provided at four corners of the LDM 59. The inclined rollers 55 are inclined from the front-and-rear direction. The inclined rollers 55 are provided to prevent the traveling portion 50 from inclining due to centrifugal force when traveling in a curved section.

The power feeding cores 57 are arranged at the front and rear of the traveling portion 50 so as to sandwich the LDMs 59 in the left-and-right direction. With the feeding portions 40E that are arranged on the track 4, power feeding in a non-contact manner and transmitting and receiving of various signals in a non-contact manner are performed. The power feeding cores 57 exchange signals with the controller 35. The LDMs 59 are provided at the front and rear of the traveling portion 50. The LDM 59 generates, by an electromagnet, a magnetic force for traveling or stopping with the magnetic plate 49 arranged on the upper surface of the track 4.

As illustrated in FIG. 1, the placement portions 9 are arranged along the track 4 and are provided at locations where delivery of the article 10 to and from the transfer vehicle 6 can be allowed. The placement portion 9 includes a buffer and a delivery port. The buffer is a placement portion on which the article 10 is placed temporarily. The buffer is a placement portion on which the article 10 is placed when, due to, for example, another article 10 being placed on an intended delivery port and the like, the article 10 that the transfer vehicle 6 is transporting cannot be transferred to the relevant delivery port. The delivery port is a placement portion to perform delivery of the article 10 to and from a semiconductor apparatus (not depicted) including a cleaning device, a film forming device, a lithography device, an etching device, a heat treatment device, and a flattening device. The processing apparatus is not limited particularly and may be various devices.

For example, the placement portion 9 defining and functioning as a buffer is arranged on the lateral side of the track 4. In this case, the transfer vehicle 6 delivers the article 10 to and from the placement portion 9, by laterally feeding the elevating drive portion 28 and the like by the lateral feed portion 24 illustrated in FIG. 2 and by slightly raising and lowering the elevating table 30. Although not depicted, the placement portion 9 may be arranged directly below the track 4. In this case, the transfer vehicle 6 delivers the article 10 to and from the placement portion 9 by raising and lowering the elevating table 30.

The controller 35 is an electronic control unit including a CPU (Central Processing Unit), a ROM (Read Only Memory), a RAM (Random Access Memory), and the like. The controller 35 is configured or programmed to control various operations in the transfer vehicle 6. Specifically, the controller 35 is configured or programmed to control the traveling portion 50, the lateral feed portion 24, the θ drive 26, the elevating drive portion 28, and the elevating table 30. The controller 35 can be configured as software for which a program stored in the ROM is loaded onto the RAM and executed by the CPU, for example. The controller 35 may be configured as hardware by an electronic circuit or the like. The controller 35 performs communication with a controller 90 (see FIG. 1) by using the feeding portions 40E (feeder cables) and the like of the track 4.

The controller 90 is an electronic control unit including a CPU (Central Processing Unit), a ROM (Read Only Memory), a RAM (Random Access Memory), and the like. The controller 90 can be configured as software for which a program stored in the ROM is loaded onto the RAM and executed by the CPU, for example. The controller 90 may be configured as hardware by an electronic circuit or the like. The controller 90 is configured or programmed to transmit a transport command that causes the transfer vehicle 6 to transport the article 10.

As illustrated in FIG. 1, the measurement units 160 are units that are provided in a portion of the track 4 and measure measurement target portions such as the traveling rollers 51 included in the transfer vehicle 6. The measurement units 160 are each arranged in the main track 4A and the introduction track 4B. The measurement unit 160 includes a dedicated track 140 (see FIG. 5) and a measurement portion 60 (see FIG. 4). As illustrated in FIG. 5 and FIG. 6, the dedicated track 140 includes frames 41 arranged at equal intervals along the transport path, a pair of lower supporting portions 43, a pair of lateral supporting portions (inspection plates) 45, power feeding portions 47, and the magnetic plate 49. By providing an elevating rail capable of descending to the ground side in a portion of the track 4 such as a traveling end and the like of the introduction track 4B, the measurement unit 160 may be provided in the ground-side track provided on the ground side so as to be continuous to the elevating rail. With such a configuration, measurement, subsequent maintenance work, and the like can be performed easily on the ground side.

The frames 41 include a pair of lateral side portions 41A and 41A and a top surface portion 41B. The pair of lateral side portions 41A are plate-shaped members facing each other in the left-and-right direction and extending in the vertical direction. The lateral side portion 41A is provided with an opening portion 41C. The lateral side portions 41A are fixed to the ceiling via brackets (not depicted) and columns (not depicted). The top surface portions 41B are plate-shaped members that connect the pair of lateral side portions 41A and 41A at the upper ends of the pair of lateral side portions 41A and 41A. The top surface portion 41B may straddle a plurality of lateral side portions 41A adjacent to each other in the array direction.

The lower supporting portions 43 are members on which the traveling rollers 51 of the transfer vehicle 6 roll and travel. The lower supporting portions 43 are fixed to the lateral side portions 41A of the frames 41 and are bridged over the frames 41 arrayed along the traveling direction. The upper surface of the lower supporting portion 43 (that is, a rolling surface of the traveling roller 51) is, at the portion connected to the track 4, connected flush with the upper surface of the lower surface portion 40B (see FIG. 2) of the track 4.

The lateral supporting portions 45 are members with which the side rollers 52 of the transfer vehicle 6 come into contact. The lateral supporting portions 45 are fixed to the lateral side portions 41A of the frames 41 and are bridged over the frames 41 arrayed along the traveling direction. The distance W3 between the pair of lateral supporting portions 45 and 45 in the left-and-right direction is equal to the distance W2 (see FIG. 2) between the outer peripheral surfaces of the side rollers 52 of the transfer vehicle 6 in the left-and-right direction. That is, the side rollers 52 and 52 of the transfer vehicle 6 travel while rolling on the pair of lateral supporting portions 45 and 45. As a result, the posture of the traveling portion 50 can be maintained in a stable (constant) manner. The side rollers 52, in this case, refer to rollers in a state where there is no wear. The inner surface of the lateral supporting portion 45 (that is, a rolling surface of the side roller 52) is, at the portion connected to the track 4, connected to the inner surface of the lateral surface portion 40C (see FIG. 2) of the track 4 via a tapered portion 45a that smoothly connects thereto. That is, the tapered portion 45a gently narrows the distance W1 between the pair of lateral surface portions 40C and 40C to the distance W3 between the pair of lateral supporting portions 45 and 45 and gently widens the distance W3 between the pair of lateral supporting portions 45 and 45 to the distance W1 between the pair of lateral surface portions 40C and 40C.

The power feeding portions 47 supply electric power to the power feeding cores 57 of the transfer vehicle 6 and transmits and receives signals to and from the power feeding cores 57. The power feeding portions 47 are fixed to the lateral side portions 41A of the frames 41 and are bridged over the frames 41 arrayed along the traveling direction. The power feeding portions 47 supply electric power to the power feeding cores 57 in a non-contact state.

The magnetic plate 49 generates a magnetic force for traveling or stopping in the LDMs 59 of the transfer vehicle 6. The magnetic plate 49 is fixed to the top surface portion 41B of the frames 41 and is bridged over the frames 41 arrayed along the traveling direction.

Figure 4:
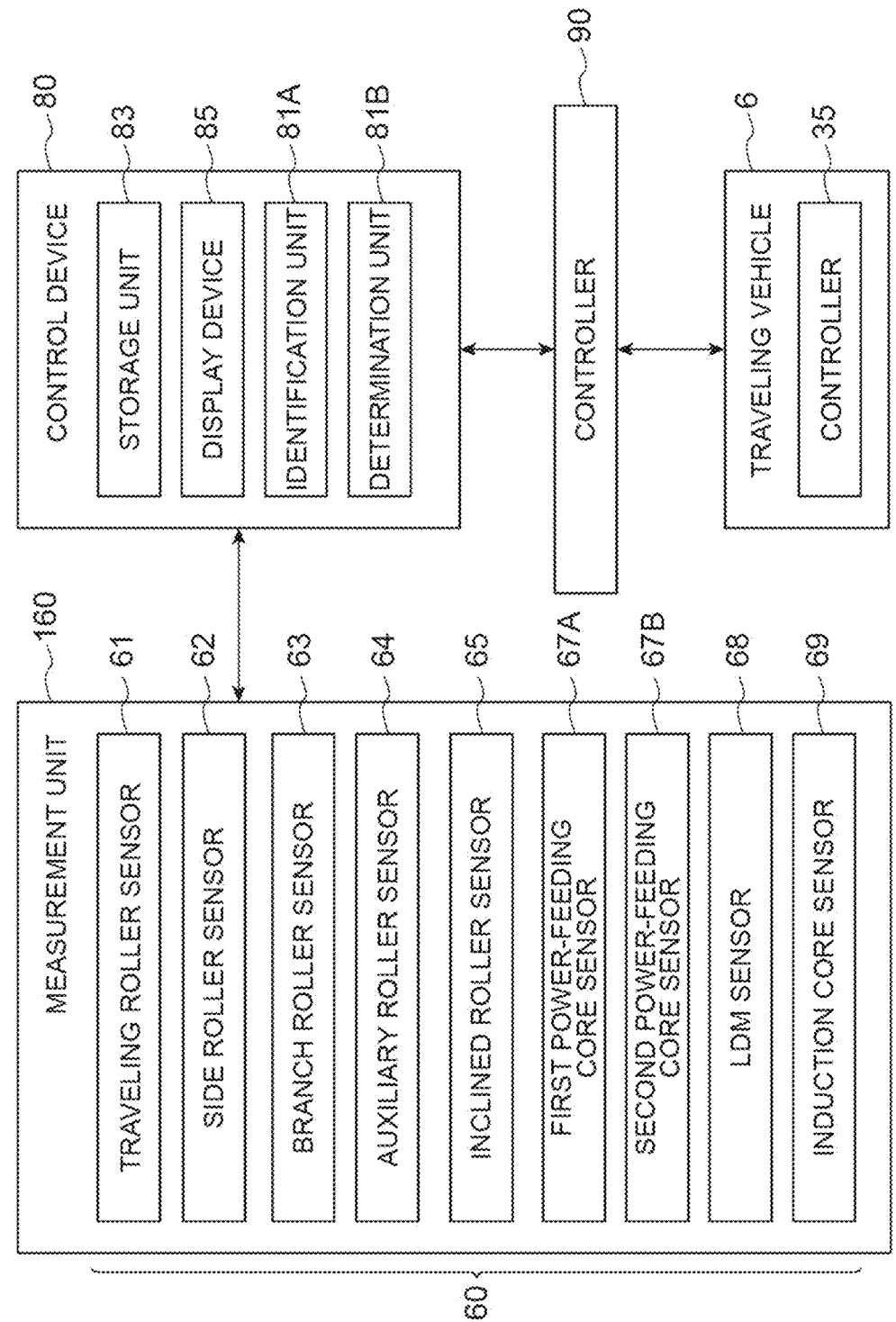
FIG. 4 is a function block diagram illustrating a functional configuration of the transfer vehicle system.
Figure 5:
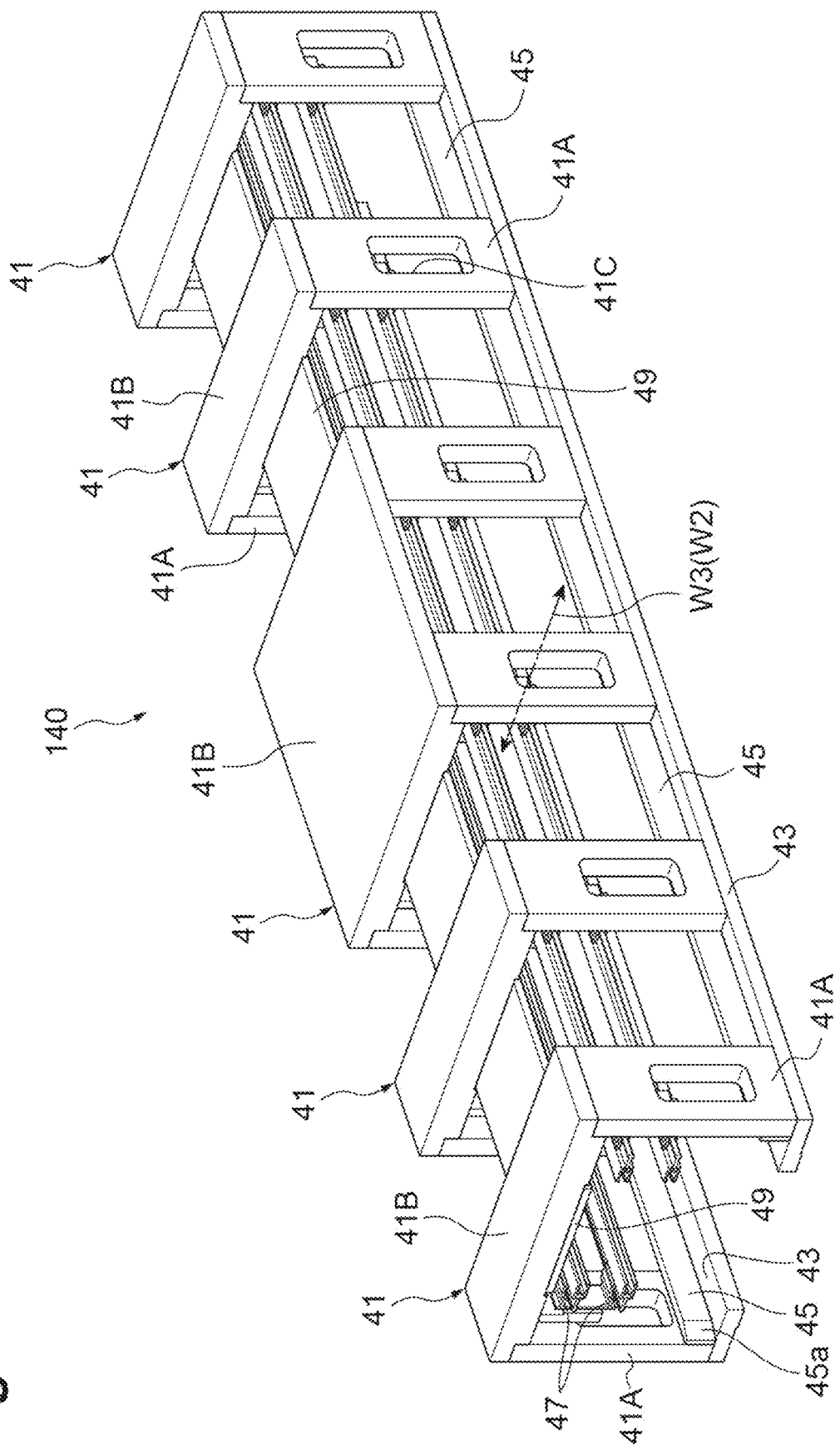
FIG. 5 is a perspective view illustrating a configuration of a dedicated track.

The measurement portion 60 illustrated in FIG. 4 includes traveling roller sensors 61, side roller sensors 62, branch roller sensors 63, an auxiliary roller sensor 64, an inclined roller sensor 65, first power-feeding core sensors 67A, second power-feeding core sensors 67B, an LDM sensor 68, and induction core sensors 69. These sensors are fixed to appropriate positions of the dedicated track 140 according to each of their purposes. The measurement values acquired by these sensors are acquired by the control device 80 at appropriate timing.

Two of the traveling roller sensors 61 are provided in order to measure each of the traveling roller 51 provided on the left side of the traveling portion 50 and the traveling roller 51 provided on the right side. The traveling roller sensors 61 are provided to monitor the amount of wear of the traveling rollers 51. The traveling roller sensors 61 measure the distance from a fixed position to the outer peripheral surface of the traveling roller 51 to thus acquire the outer diameter H51 (see FIG. 6) of the traveling roller 51.

Two of the side roller sensors 62 are provided in order to measure each of the side roller 52 provided on the left side of the traveling portion 50 and the side roller 52 provided on the right side. The side roller sensors 62 are provided to monitor the amount of wear of the side rollers 52 and the distance between the side rollers 52 and 52 on the left and right. The side roller sensors 62 measure the distance from a fixed position to the outer peripheral surface of the side roller 52 to thus acquire the outer diameter W521 (see FIG. 6) of the side rollers 52 and the distance W522 (see FIG. 6) between the side rollers 52 and 52.

Two of the branch roller sensors 63 are provided in order to measure each of the branch roller 53 provided on the left side of the traveling portion 50 and the branch roller 53 provided on the right side. The branch roller sensors 63 may be provided for each of the upper and lower branch rollers 53. The branch roller sensors 63 are provided to monitor the amount of wear of the branch rollers 53 and the distance between the left and right branch rollers 53 and 53. The branch roller sensors 63 measure the distance from a fixed position to the outer peripheral surface of the branch roller 53 to thus acquire the outer diameter W531 (see FIG. 6) of the branch rollers 53 and the distance W532 (see FIG. 6) between the branch rollers 53 and 53.

The auxiliary roller sensor 64 is provided to monitor the amount of wear of the auxiliary rollers 54 and the height of the auxiliary rollers 54 with the lower supporting portion 43 as the reference. The auxiliary roller sensor 64 measures the distance from a fixed position to the outer peripheral surface of the auxiliary roller 54 to thus acquire the outer diameter H541 (see FIG. 6) of the auxiliary roller 54 and the height position H542 (see FIG. 6) of the auxiliary roller 54 with the lower supporting portion 43 as the reference.

The inclined roller sensor 65 is provided to monitor the amount of wear of the inclined rollers 55 and the height of the inclined rollers 55 with the lower supporting portion 43 as the reference. The inclined roller sensor 65 measures the distance from a fixed position to the outer peripheral surface of the inclined roller 55 to thus acquire the outer diameter H551 (see FIG. 6) of the inclined roller 55 and the height position H552 (see FIG. 6) of the inclined roller 55 with the lower supporting portion 43 as the reference.

The first power-feeding core sensors 67A are provided to monitor the height of the upper surface 57a of the power feeding core 57 with the lower supporting portion 43 as the reference. The first power-feeding core sensors 67A measure the distance from a fixed position to the upper surface 57a of the power feeding core 57 to thus acquire the height position H571 (see FIG. 6) of the upper surface 57a of the power feeding core 57 with the lower supporting portion 43 as the reference.

The second power-feeding core sensors 67B are provided to monitor the presence of the core in the power feeding core 57 and the lifting of the core. As the second power-feeding core sensor 67B, a limited reflection sensor is used to confirm the presence of the core and a distance measuring sensor is used to confirm the lifting of the core, for example.

The LDM sensor 68 is provided to monitor the height of the LDM 59 with the lower supporting portion 43 as the reference. The LDM sensor 68 measures the distance from a fixed position to the upper surface 59a of the LDM 59 to thus acquire the height position H592 (see FIG. 6) of the LDM 59 with the lower supporting portion 43 as the reference.

The induction core sensors 69 are provided to monitor whether induction cores 37 provided in the main body portion 7 of the transfer vehicle 6 are in a communicable state. The induction core sensor 69 is a plate-shaped sensor with a built-in communication line and confirms whether a signal from the induction core 37 can be received normally by the built-in communication line.

The control device 80 is provided to be communicable with the measurement portion 60 (that is, each of the above-described sensors) in the measurement unit 160. The control device 80 includes a CPU, a main storage unit such as a RAM and a ROM, a storage unit 83 as an auxiliary storage unit exemplified by a hard disk, a flash memory, and the like, an input unit (not depicted) such as a keyboard and a mouse, and a display device (notification unit) 85 as an example of an output unit. An identifier 81A and a determination unit 81B defined by the CPU and the main storage unit such as the RAM and the ROM are executed under the control of the CPU, by loading predetermined computer software on the hardware such as the CPU and the main storage unit.

The identifier 81A identifies the transfer vehicle 6 for which the measurement target portion has been measured by the above-described sensor as the measurement portion 60. When the transfer vehicles 6 are in normal operation, the controller 90 receives a report from each transfer vehicle 6 and comprehends the current position of each transfer vehicle 6 at all times. Thus, the controller 90 is able to easily identify the transfer vehicle 6 for which the measurement target portion has been measured. For example, when measuring on the ground-side track via the elevating rail, the transfer vehicle 6 may be identified by reading with a camera a vehicle number sticker of the transfer vehicle 6 that has been measured or reading with a reader an ID tag and the like of the transfer vehicle 6 that has been measured.

The determination unit 81B determines, based on a measurement result acquired by the measurement portion 60 and a reference value stored in the storage unit 83, information concerning the state of the measurement target portion. For example, when the measurement result has exceeded a predetermined value, the determination unit 81B causes the display device 85 to display accordingly. When the rate of change calculated based on the measurement result stored in the storage unit 83 has exceeded a predetermined value, the determination unit 81B causes the display device 85 to display accordingly.

When the measurement result acquired from the measurement unit 160 arranged on the introduction track 4B exceeds a predetermined value, the determination unit 81B not only causes the display device 85 to display accordingly, but also stops the traveling of the relevant transfer vehicle 6 in the measurement unit 160.

The storage unit 83 stores therein the measurement result measured by the measurement portion and the identification result identified by the identifier 81A in association with each other. The storage unit 83 stores the measurement result of each transfer vehicle 6 in chronological order. For example, the measurement value of the traveling roller 51 acquired by the traveling roller sensor 61 is stored in chronological order by the storage unit 83.

The display device 85 displays information concerning the measurement target portion determined by the determination unit 81B based on the measurement result and the reference value. Specifically, when the determination unit 81B has determined that the measurement result exceeded the predetermined value, the display device 85 displays accordingly. In addition, when the determination unit 81B has determined that the rate of change of the measurement result exceeded the predetermined value, the display device 85 displays accordingly.

The measurement unit 160 in the above-described configuration may acquire the measurement data by measuring the measurement target portions of the transfer vehicle 6 each time the transfer vehicle 6 passes by or may acquire the measurement data at, for example, each predetermined interval. The measurement unit 160 may acquire the measurement data only from the transfer vehicle 6 that has traveled a predetermined traveling distance. In addition, the measurement unit 160 arranged on the introduction track 4B is able to acquire an initial value of each measurement target portion in the transfer vehicle 6 when the use of the transfer vehicle 6 is started.

Next, the operations and advantageous effects of the transfer vehicle system 1 of the above-described preferred embodiment will be described. The transfer vehicle system 1 of the above-described preferred embodiment is provided with the measurement portion including the traveling roller sensors 61 and the like that measure the measurement target portions such as the traveling rollers 51 of the transfer vehicle 6 at a portion along the track 4, so that measuring the measurement target portions from the transfer vehicle 6 in operation (traveling) at the manufacturing site can be made. That is, the measured value of the measurement target portion can be obtained without human intervention. Although a plurality of transfer vehicles 6 are traveling in the transfer vehicle system 1, the transfer vehicle 6 for which the measurement target portions have been measured is identified by the identifier 81A, so that the relevant measurement results are stored for each transfer vehicle 6. Accordingly, the worker can, based on the measured values for each transfer vehicle 6, perform maintenance at appropriate timing for each transfer vehicle 6. As a result, the maintenance work of each transfer vehicle 6 can be made efficient.

When the measurement result has exceeded the predetermined value, the transfer vehicle system 1 of the above-described preferred embodiment notifies accordingly. For example, if a predetermined value that needs component replacement or adjustment is set in advance, notifying of the transfer vehicle 6 that needs component replacement or adjustment will be made automatically.

In the transfer vehicle system 1 of the above-described preferred embodiment, when the rate of change of the measurement value has exceeded a predetermined value, the storage unit 83 notifies accordingly. For example, if the rate of change that needs component replacement or adjustment is set in advance, notifying of the transfer vehicle 6 that needs component replacement or adjustment will be made automatically. As a result, even when each transfer vehicle 6 has a different initial value of the measurement target portion, it is possible to appropriately determine the presence of a transfer vehicle 6 that has an abnormality.

In the transfer vehicle system 1 of the above-described preferred embodiment, the measurement unit 160 is provided at the main track 4A, so that measuring the measurement target portions from the transfer vehicle 6 in operation (traveling) at the manufacturing site can be made. Moreover, the measurement unit 160 is provided at the introduction track 4B, so that the initial values of the transfer vehicle 6 before operation can be measured, and an initial failure, maintenance failure, or the like in which the transfer vehicle 6 cannot be operated can be detected in advance in the introduction track 4B.

The dedicated track 140 of the transfer vehicle system 1 of the above-described preferred embodiment presses the traveling portion 50 in the left-and-right direction. That is, the pair of lateral supporting portions 45 and 45 come in contact with both side rollers 52 and 52 of the traveling transfer vehicle 6. With this configuration, the measurement target portions can be measured in a state in which the traveling portion 50 is maintained in the same posture, so that the measurement accuracy can be increased.

In the transfer vehicle system 1 of the above-described preferred embodiment, the dedicated track 140 is different from the normal track 4 and is configured such that the lower supporting portions 43, the lateral supporting portions 45, the power feeding portions 47, and the magnetic plate 49 are bridged over the frames 41 (configured in a frame shape), so that visually recognizing the traveling portion 50 traveling inside the dedicated track 140 is easy. That is, in the transfer vehicle system 1 of the above-described preferred embodiment, placing the sensors constituting the measurement portion 60 that measure the respective measurement target portions at an appropriate location is easy.

As in the foregoing, preferred embodiments of the present invention has been described. However, one aspect of the present invention is not limited to the above-described preferred embodiments, and various modifications can be made without departing from the spirit of the present invention.

In the measurement unit 160 of the above-described preferred embodiments, as an example to make the posture of the traveling portion 50 stable in the measurement unit 160, an example of providing the pair of lateral supporting portions 45 and 45 that are set shorter than the distance W1 in the left-and-right direction of the pair of lateral surface portions 40C and 40C of the track 4 has been described, but the preferred embodiments is not limited thereto. For example, as illustrated in FIG. 7, a pair of lateral supporting portions (inspection plates) 245 and 245 may be movable in the left-and-right direction and spring members 246 and 246 that exert a load on each of the pair of lateral supporting portions 245 and 245 toward the inside may be provided. In this configuration, as with the above-described preferred embodiments, the posture of the traveling portion 50 can be made stable. Moreover, in the configuration of the present modification, even when the side roller 52 is worn, the posture of the traveling portion 50 can be steadily made stable.

In the measurement unit 160 according to the modification, when measuring the side rollers 52 pressed by the pair of lateral supporting portions 245 and 245, in place of the method of measuring the outer peripheral surfaces of the side rollers 52 by the side roller sensors 62, the side roller sensors 62 may be made to measure the positions of the pair of lateral supporting portions 245 and 245 pressing the side rollers 52. Even in this case, the amount of wear of the side roller 52 can be measured indirectly. Moreover, in this method, even with the traveling portion 50 in which the components difficult to measure from the point of view of the side roller sensors 62 are arranged in a complicated manner, reliable measurement can be made.

In place of the configuration in which the pair of lateral supporting portions 245 and 245 are made to move in the left-and-right direction by the spring members 246 and 246, it may be configured such that the pair of lateral supporting portions 245 and 245 are moved in the left-and-right direction by a moving mechanism (not depicted). In this case, based on the rotation speed and the like of a motor of the moving mechanism, the amount of movement of the pair of lateral supporting portions 245 and 245 may be acquired, and the amount of wear of the side roller 52 may be measured indirectly from the relevant amount of movement.

In the above-described preferred embodiments and the modifications, the pair of lateral supporting portions 45 and 45 (245 and 245) have made the traveling portion 50 stable by pressing the outer peripheral surfaces of the side rollers 52, but other members, for example, the outer peripheral surface of the branch roller 53 may be pressed or the lateral surface of the traveling roller 51 may be pressed.

In the above-described preferred embodiments and the modifications, an example in which the dedicated track 140 was used as a track to define the measurement unit 160 has been described, but it may be the normal track 4.

In the above-described preferred embodiments and the modifications, the measurement unit 160 for which the measurement portion 60 and the dedicated track 140 are unitized has been described as an example, but it may be in a configuration in which the measurement portion 60 is placed on the existing track 4.

In the above-described preferred embodiments and the modification, an example in which various sensors are used to measure the measurement target portions of the traveling portion 50 has been described, but in place of or in addition to this, for example, an imaging device such as a camera may be used. An example in which the above-described measurement portion 60 is provided with dedicated sensors for corresponding measurement target portions has been described, but it may be configured such that one sensor measures a plurality of measurement target portions.

In the above-described preferred embodiments, an example having applied to the track 4 on which the transfer vehicle 6 suspends and travels has been described, but preferred embodiments of the present invention are also applicable to transfer vehicle systems for which transfer vehicles travel on a track arranged on the ground.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transfer vehicle system in which a plurality of transfer vehicles travel on a predetermined transport path, the transfer vehicle system comprising:
 a measurement portion provided at a portion of a path continuing to the transport path to measure a measurement target portion included in the transfer vehicle located on the continuing path;
 an identifier to identify the transfer vehicle for which the measurement target portion has been measured by the measurement portion;
 a storage to store a measurement result measured by the measurement portion and an identification result identified by the identifier in association with each other; and
 a notifier to provide notification of information concerning a state of the measurement target portion determined based on the measurement result and a reference value; wherein
 the transport path includes a track on which a traveling portion of the transfer vehicle travels;
 the track includes an inspection plate to press the traveling portion in a width direction perpendicular or substantially perpendicular to an extending direction of the track; and
 the measurement portion measures the measurement target portion of the transfer vehicle in a state of being pressed by the inspection plate.

2. The transfer vehicle system according to claim 1, wherein the measurement portion measures a distance to the inspection plate.

3. The transfer vehicle system according to claim 1, wherein when the measurement result has exceeded a predetermined value, the notifier provides the notification accordingly.

4. The transfer vehicle system according to claim 3, wherein the measurement portion measures a distance to the inspection plate.

5. The transfer vehicle system according to claim 1, wherein
 the storage stores the measurement result for each transfer vehicle in chronological order; and when a rate of change calculated based on the measurement result stored in the storage has exceeded a predetermined value, the notifier provides the notification accordingly.

6. The transfer vehicle system according to claim 5, wherein the measurement portion measures a distance to the inspection plate.

7. The transfer vehicle system according to claim 1, wherein
- the transport path includes a main path circulating in a predetermined area in one direction and an introduction path to introduce the transfer vehicle into the main path; and
- the measurement portion is provided on the introduction path.

8. The transfer vehicle system according to claim 7, wherein the measurement portion measures a distance to the inspection plate.

* * * * *